United States Patent [19]

Heller et al.

[11] 4,137,464
[45] Jan. 30, 1979

[54] CHARGE-TRANSFER BINARY SEARCH GENERATING CIRCUIT

[75] Inventors: Lawrence G. Heller, Brewster; Lewis M. Terman, South Salem, both of N.Y.

[73] Assignee: International Business Machines Corporation, Armonk, N.Y.

[21] Appl. No.: 825,016

[22] Filed: Aug. 16, 1977

Related U.S. Application Data

[63] Continuation of Ser. No. 670,781, Mar. 26, 1976, abandoned.

[51] Int. Cl.² ............................................. H03K 4/02
[52] U.S. Cl. ............................... 307/227; 307/221 D; 307/246; 320/1; 328/186
[58] Field of Search ....... 340/347 M, 347 C, 173 CA; 307/221 C, 221 D, 246, 227, 238; 357/24; 320/1; 330/176, 177; 328/186

[56] References Cited

U.S. PATENT DOCUMENTS

| | | |
|---|---|---|
| 3,750,143 | 7/1973 | Osborne ........................ 340/347 AD |
| 3,906,488 | 9/1975 | Suarez-Gartner ................ 340/347 C |

*Primary Examiner*—John Zazworksy

*Attorney, Agent, or Firm*—John J. Goodwin

[57] ABSTRACT

A bucket brigade circuit is described for generating a sequence of packets of charge carriers of the form $Q_R/2$, $Q_R/4$, $Q_R/8$....$Q_R/2^N$ where N is an integer. The charge packets thus generated can be employed in combinations in either digital-to-analog or analog-to-digital converters. The charge generation circuit requires two equal capacitors which are used for charge redistribution. To obtain accurate quantities of charge in the generated charge packets the capacitors employed should be large, however the use of large capacitors results in low operating speed because of the large charge transfer time constants involved. The described circuit provides a scheme to reduce charge transfer time constants and therefore obtain greater speed while still permitting the use of large capacitors for high accuracy. The circuit includes a small coupling capacitor connected in series with one of the charge redistribution capacitors to produce a total capacitance which is equal to or smaller than the coupling capacitance. The sequence of charge carriers produced by the circuit can be injected into either a bucket brigade circuit or a charge-coupled-device circuit for use, for example, in digital-to-analog and analog-to-digital converters.

4 Claims, 3 Drawing Figures

CHARGE-TRANSFER BINARY SEARCH GENERATING CIRCUIT

This is a continuation of application Ser. No. 670,781 filed Mar. 26, 1976, now abandoned.

BACKGROUND OF THE INVENTION

1. Field of the Invention

The present invention relates to charge-transfer circuits for generating a sequence of predetermined charge packets, and more particularly to a bucket brigade circuit for generating charge packets which may be used in digital-to-analog and analog-to-digital converter circuit applications for binary search.

2. Description of the Prior Art

The basic concept of using pairs of equal capacitors in circuits for producing charge quantities is known. A specific example of a two capacitor circuit employed for producing binary search signals for an analog-to-digital circuit is described in the publication "An ALL-MOS Charge-Redistribution A/D Conversion Technique", R. E. Suarez, P. R. Gray and D. A. Hodges, 1974 ISSCC Digest, p. 194, February 1974. The two capacitor circuit is shown in FIG. 2 thereof and consists of two equal capacitors C1 and C2 and three switches S1, S2, and S3 under logic control.

In FIG. 2, the digital-to-analog conversion begins with both capacitors discharged and is accomplished serially by considering the least significant bit $b_O$ first. If this bit is a one, S2 is closed momentarily charging C2 to $V_R$; if it is a zero, C2 is left discharged. Switch S1 is then closed momentarily, sharing charge between the capacitors and resulting in a voltage $V_{out}$ of $$V_{out} = [b_O V_R/2]$$

Leaving the charge on D1, the precharging of C2 is repeated, this time considering the next least significant bit $b_1$. After redistribution, the output voltage is $$V_{out} = (b_O V_R/4) + (b_1 V_R/2)$$

This repetitive procedure can be carried out for higher order bits.

The circuit described in the cited publication specifically generates a sequence of voltages for a binary search of the form $V/2 + V/4 + V/8 + \ldots$ etc. A circuit for generating a more general sequence of charge packets $V/2$, $V/4$, $V/8$ etc. which may be later combined to produce a binary search sequence is described in copending patent application Ser. No. 662,626, filed Mar. 1, 1976 in the names of L. G. Heller et al and assigned to the present assignee. In the copending application an embodiment of a bucket brigade charge transfer circuit employing two equal capacitors for charge redistribution is illustrated in FIG. 7 thereof. The bucket brigade circuit, when employed in analog-to-digital applications for binary search generation is an improvement over the circuit of the Suarez et al publication for the reasons set forth in the patent application.

The present invention relates to an improvement over the circuit of the copending application and also copending application Ser. No. 636,862, filed Dec. 2, 1975 in the name of L. G. Heller and assigned to the present assignee, because it permits the use of pairs of large capacitors for accuracy while still allowing high speed operation. The inventive concept is carried out by employing a relatively small capacitor in combination with the aforesaid two large capacitors, a feature which is not taught or suggested in the prior art references.

SUMMARY OF THE INVENTION

An object of the present invention is to provide an improved charge packet generating circuit including charge redistribution techniques.

Another object of the present invention is to provide an improved charge packet generating circuit employing charge transfer technology.

A further object of the present invention is to provide an improved charge packet generating circuit including a pair of large charge storage capacitors and a small coupling capacitor.

A further object of the present invention is to provide an improved charge packet generating circuit which may be employed in digital-to-analog and analog-to-digital converters.

The foregoing and other objects, features and advantages of the invention will be apparent from the following more particular description of a preferred embodiment of the invention, as illustrated in the accompanying drawings.

DETAILED DESCRIPTION OF THE INVENTION

Figure 1:
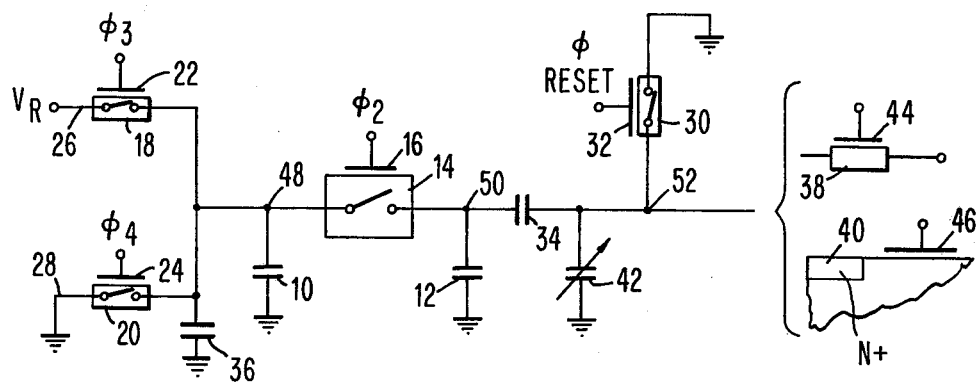
FIG. 1 is a schematic diagram illustrating an embodiment of a bucket brigade charge redistributing circuit for charge packet generation according to the principles of the present invention.

As previously stated, the present invention is directed to the use of a relatively small series capacitor in combination with a pair of large equal valued capacitors in a charge transfer circuit employing charge redistribution to rapidly generate accurate size charge packets $Q_R/2$, $Q_R/4$, $Q_R/8$ etc. Referring to FIG. 1, a charge transfer circuit employing bucket brigade technology is illustrated including a first capacitor 10 (C1) and a second capacitor 12 (C2) where C1=C2. Capacitors 10 and 12 are interconnected by an FET switch 14 operated in a conventional manner by phase pulse signals applied to control electrode 16. The phase signals applied to electrode 16 are designated "phase 2". Transistors 18 and 20 are transistor switches having control electrodes 22 and 24 respectively. A phase pulse signal "phase 3" is applied to electrode 22 and a phase pulse signal "phase 4" is applied to electrode 24. An input voltage $V_R$ is applied to current carrying electrode 26 of transistor 18 and current carrying electrode 28 of transistor 20 is connected to ground. A reset transistor 30 is provided having a control electrode 32 to which a reset pulse "phase reset" is applied to complete a path to ground. A coupling capacitor 34 is provided which is relatively small in comparison with the value of capacitors 10 and 12. A matching capacitor 36 equal in value to capacitor 34 is provided to balance the circuit.

The circuit of FIG. 1 is used to generate charge packets which are injected into the input transistor 38 of a bucket brigade circuit or to an input diffusion 40 of a charge-coupled-device. Accordingly, a capacitor 42 is illustrated to represent the parasitic input capacitance of the bucket brigade or charge-coupled device. The bucket brigade input transistor 38 includes a control electrode 44 to which a phase pulse "phase 1" is applied having a value $V_g$. In the case of the charge-coupled-switch an input electrode 46 is included to which the phase 1 pulse of value $V_g$ is applied. It is assumed throughout the description of the invention that a conventional phase pulse generator is available to generate the various pulses phase 1, phase 2, phase 3 etc. applied to the designated electrodes.

Figure 3:
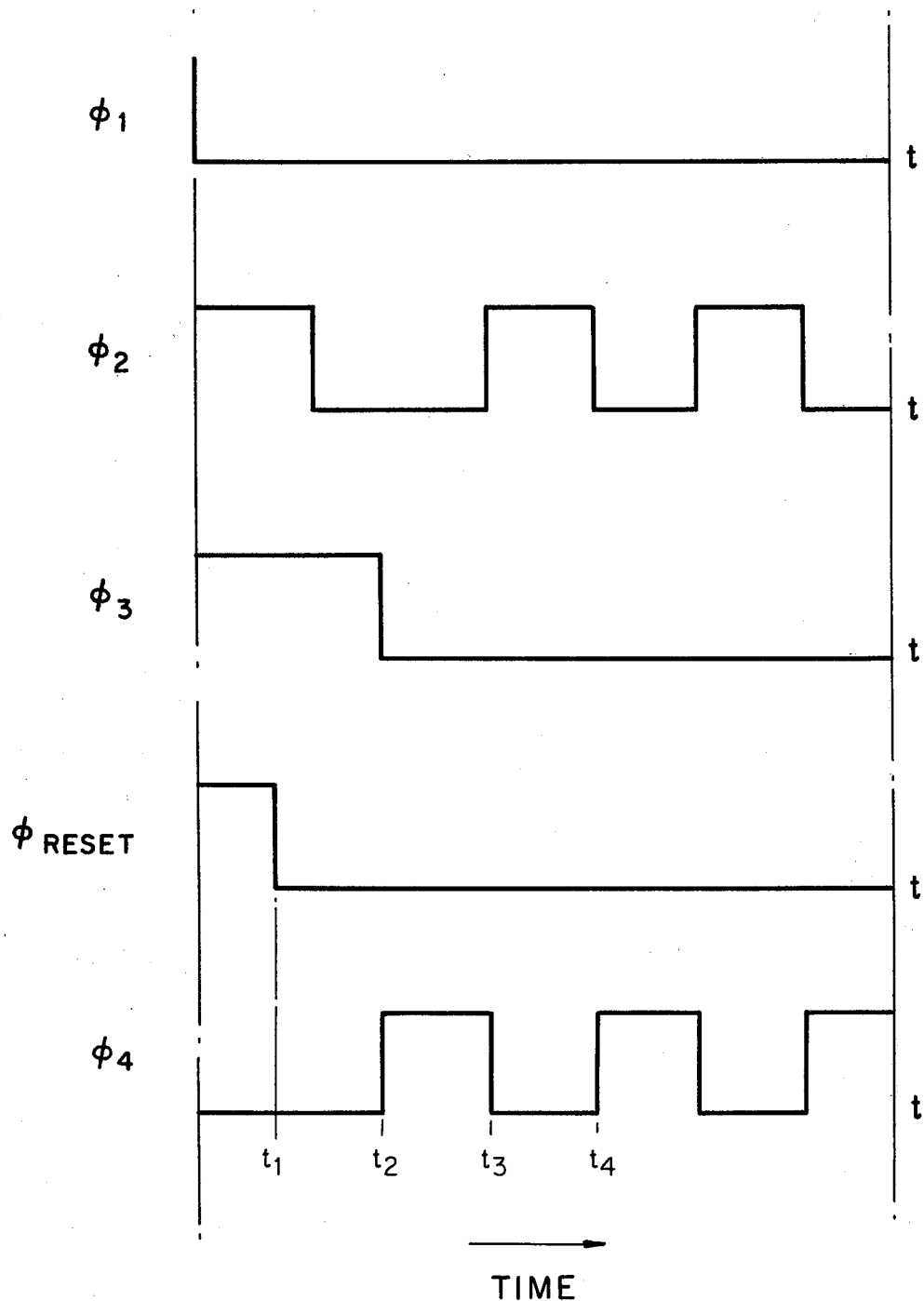
FIG. 3 is an illustration of a waveform diagram useful in explaining the operation of the circuit embodiment of FIG. 1.

The functions of the aforesaid circuit components can be understood from the following description of the operating cycle of the circuit of FIG. 1 in conjunction with the waveforms illustrated in FIG. 3. Initially, at time $t_0$ the phase 1 pulse goes on to a level $V_g$ and remains on as shown in the first waveform of FIG. 3. The reset phase applied to transistor 30, phase 2 applied to switch 14 and phase 3 applied to transistor 22 also go on at $t_0$ charging node 50 to $V_R$ as illustrated in the sixth waveform of FIG. 3. The reset phase goes off at $t_1$ and node 52 between capacitor 34 and transistor 30 charges up to $V_g - V_{th}$ (as shown in the seventh waveform of FIG. 3) where $V_{th}$ is the threshold voltage value of transistor 44 (or of the charge-coupled device) which is operated in saturation.

Phase 2 goes off between $t_1$ and $t_2$ and switch 14 opens, thereby isolating node 50 of capacitor 12 at a voltage $V_R$, the input voltage. At $t_2$, phase 3 goes off, thereby turning transistor 18 off, and phase 4 at transistor 20 turns on, thereby discharging node 48 of capacitor 10 from $V_R$ to ground. At time $t_3$ the phase 4 pulse goes off thereby isolating node 48 from ground. At the same time phase 2 goes back on and the charge on capacitor 12 due to $V_R$ redistributes between nodes 48 and 50, discharging node 50 to a level $V_R/2$, and a packet of associated charge $Q_R/2$ is injected into either transistor 38 or the charge-coupled-device where $Q_R = V_R \times C_{34}$. Phase 2 then goes off at time $t_4$ opening switch 14 and phase 4 goes on again, discharging node 48 back to ground through transistor 20. At time $t_5$ phase 4 at transistor 20 goes off, again isolating node 48 from ground, and phase 2 goes on closing switch 14 and the charge on capacitor 12 due to $V_R/2$ redistributes between nodes 48 and 50. Node 50 is discharged to a level $V_R/4$ and a packet of charge $Q_R/4$ is injected into the bucket brigade or charge-coupled-device.

In like manner the circuit of FIG. 1 can continue to cycle to inject or transfer charge packets of $Q_R/8$, $Q_R/16$, $Q_R/32$ etc. A feature of the circuit of FIG. 1 is that with capacitance 34 coupled to node 52, the resultant capacitance as seen by transistor 38 or the charge-coupled-device is substantially the value of capacitance 34 plus capacitance 42 which is much less than either capacitance 12 or 10. Since capacitance 34 is in series with the parallel combination of capacitors 10 and 12 (when switch 14 is closed), and since capacitances 10 and 12 are much greater than capacitance 34, the resultant capacitance as seen by transistor 38 (i.e. at node 52) is equal to the capacitance 42 plus a value somewhat less than capacitance 34. As to the loading seen by transistor 14, if capacitor 34 were not present, as in the case of the Suarez et al prior art reference, the transistor 14 (i.e. node 50) would see capacitors 12 and 42 in parallel. The presence of capacitor 34 in series gives an effective capacitance of 34 and 42 in series which is less than either capacitors 34 or 42 alone. Thus the effective loading on node 50 as seen by transistor 14 is also reduced, however since capacitors 34 and 42 are small compared to capacitor 12, this is a very small effect. Thus, capacitances 10 and 12 may be large for high accuracy whereas the effective capacitance for the combination of capacitors 10 and 12 in parallel and in series with capacitor 34 is less than the capacitance of parallel combination of capacitor 10 and 12 alone.

With series capacitor 34 in the circuit, the effective capacitance connected to node 52 consists of the sum of capacitor 42 and the series combination of capacitor 34 with the parallel sum of capacitors 10, 12 and 36. Without series capacitor 34 in the circuit, the capacitance of node 52 would be the sum of capacitors 42, 12, 10 and 36, resulting in a much larger capacitance than when series capacitor 34 is included in the circuit.

Figure 2:
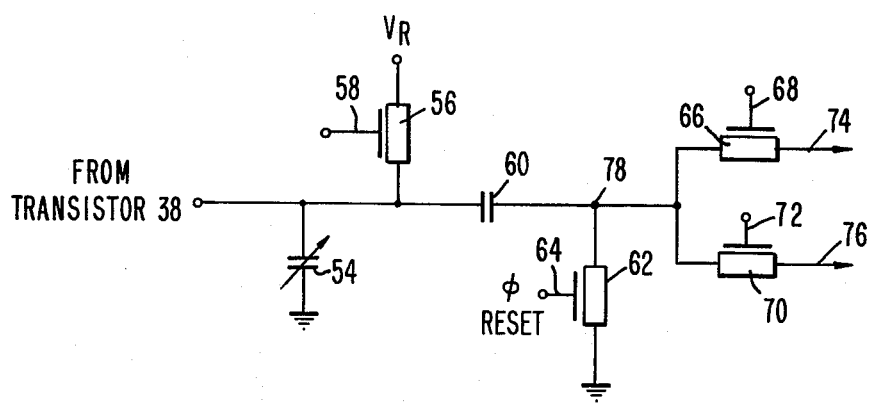
FIG. 2 is a schematic diagram illustrating an embodiment of a charge diverting circuit which may be used in combination with the circuit embodiment of FIG. 1.

As previously discussed, and as described in the copending patent application Ser. No. 662,626, a circuit of the type illustrated in FIG. 1 can be used to generate a charge packet sequence which can be employed to produce a digital-to-analog or analog-to-digital conversion. To perform analog-to-digital conversion the packets generated by the circuit of FIG. 1 must be selectively added to charge at one of two possible charge storage regions as set forth in the copending patent application. This requires a diverter means for directing the charge packets to different summing nodes depending on the result of a comparison occurring in a comparator. In the case of a charge-coupled-device application the transfer of a packet of charge can be directed off the charge-coupled-device input stage of FIG. 1 without difficulty. However, to transfer a signal from input transistor 44 of FIG. 1 by bucket brigade action, threshold difference effects must be eliminated. Thus for purposes of showing utility, a bucket brigade diverter circuit for transferring packets in two different directions is illustrated in FIG. 2. Before any charge Q is transferred from transistor 38, node 78 is charged to $V_g - V_{th}$ where $V_{th}$ is the threshold voltage transistor 66 or 70 depending on whether the charge is to be transferred to output 74 or output 76, and the gate of the particular transistor 66 or 70 is left at voltage $V_g$. When a charge quantity Q is transferred from transistor 38, a charge packet Q summing $= QC_{60}/(C_{60}+C_{54})$ is transferred onto output 74 or output 76 as required. Capacitance 54, which is the circuit parasitic capacitance is much less in value than that of the coupling capacitor 60 so that distortion and attenuation due to the nonlinear parasitic capacitance 54 is minimized.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A circuit for generating a binarily decreasing sequence of electrical signal levels comprising:
   a first capacitive electrical signal storage means adapted to store up to a predetermined quantity of electrical signal $E_R$,
   a second capacitive electrical signal storage means also adapted to store up to said predetermined quantity of electrical signal $E_R$,
   an electrical signal transfer means including a first switching element providing an open state and a closed state and connected between said first and second capacitive electrical signal storage means for transferring a selected amount of electrical signal of said predetermined quantity of electrical signal $E_R$ from one of said capacitive storage means to the other of said capacitive storage means when said switching element is closed during a given time period, said first and second capacitive electrical storage means being connected in parallel when said switching element is closed to produce a parallel capacitance value, an output terminal, a third capacitive electrical signal storage means having a capacitance relatively smaller than the capacitance of said first and second capacitive electrical signal storage means and having one side thereof connected in series circuit with said second capacitive electrical signal storage means and the other side of said third capacitive electrical signal storage means being connected to said output terminal, said third capacitive electrical signal storage means being connected in series with the parallel combination of said first and second capacitive electrical signal storage means when said switching element is closed to produce a combined capacitance value with said first and second capacitive electrical signal storage means which is less than the said parallel capacitance value of said first and second capacitive electrical signal storage means, a source of reference potential, a second switching element connected between said source of reference potential and said first electrical capacitive signal storage means, and means including first and second signal conductors for producing a plurality of sequential control signals including a first sequence of electrical pulses occurring at a selected time sequence on said first signal conductor connected to said first switching element of said electrical signal transfer means for placing said first switching element into said open and closed states and a second sequence of electrical pulses occurring at said selected time sequence on said second signal conductor connected to said second switching element, said first and second sequence of signals and said associated first and second switching elements operating in combination for controlling the transfer of quantities of electrical signal between said first and second capacitive storage means for producing a binarily decreasing sequence of electrical signal quantities at said output terminal of the form $E=E_R/2$, $E_R/4$, $E_R/8$ up to $E_R/2^N$ where $N$ is a positive integer.

2. A generating circuit according to claim 1 wherein said capacitive electrical signal stored in said first and second electrical signal storage means is in the form of electrical charge carriers, said first and second storage means are charge carrier storage means (adapted to store up) to a predetermined quantity of charge carriers $Q_R$, and said binarily decreasing sequence of electrical signal quantities is a sequence of charge quantities of the form $Q=Q_R/2$, $Q_R/4$, $Q_R/8$, up to $Q_R/2^N$.

3. A generating circuit according to claim 2 wherein said first and second charge carrier storage means are first and second capacitors for storing predetermined quantities of charge carriers, each of said capacitors having one side thereof respectively connected to first and second nodes, wherein said third capacitive electrical signal storage means is a third capacitor having one side thereof connected to said second node and the other side connected to said output terminal and having a capacitance relatively smaller than that of said first capacitor or said second capacitor to produce said combined capacitance having a value less than said value of first and second capacitors connected in parallel circuit, and wherein said first switching element of said charge carrier transfer means is a transistor having first and second current carrying electrodes respectively connected to said first and second nodes for transferring selected amounts of charge carriers from one of said first and second capacitors to the other of said first and second capacitors and a third electrode connected to and responsive to said first sequence of electrical pulses on said first signal conductor.

4. A generating circuit according to claim 3 further including means for transferring said binarily decreasing sequence of electrical signal quantities from said output terminal, said transferring means including a source of control signal and a second transistor having a first current carrying electrode connected to said output terminal, a control electrode connected to said source of control signal and a second current carrying electrode onto which said generated sequence of charge carriers are transferred, an input means including a third transistor having a first current carrying electrode connected to said first node for supplying charge carriers to said first node, and wherein said second switching element includes a fourth transistor having first and second current carrying electrodes connected respectively to said source of reference potential and to said first node and a control electrode connected to and responsive to said second sequence of electrical pulses on said second signal conductor, said second switching element including said fourth transistor functioning to remove charge carriers from said first node.

* * * * *